(12) United States Patent
Yahata et al.

(10) Patent No.: US 9,252,090 B2
(45) Date of Patent: Feb. 2, 2016

(54) RESIN PACKAGE

(71) Applicant: Panasonic Corporation, Osaka (JP)

(72) Inventors: Kazuhiro Yahata, Osaka (JP); Takashi Uno, Hyogo (JP); Hikaru Ikeda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 118 days.

(21) Appl. No.: 13/980,336

(22) PCT Filed: Feb. 14, 2013

(86) PCT No.: PCT/JP2013/000817
§ 371 (c)(1),
(2) Date: Jul. 18, 2013

(87) PCT Pub. No.: WO2013/145532
PCT Pub. Date: Oct. 3, 2013

(65) Prior Publication Data
US 2014/0239470 A1 Aug. 28, 2014

(30) Foreign Application Priority Data
Mar. 28, 2012 (JP) .................. 2012-075061

(51) Int. Cl.
*H01L 23/34* (2006.01)
*H01L 23/495* (2006.01)
(Continued)

(52) U.S. Cl.
CPC .... *H01L 23/49568* (2013.01); *H01L 23/49503* (2013.01); *H01L 23/49531* (2013.01); *H01L 23/49548* (2013.01); *H01L 23/13* (2013.01); *H01L 23/3107* (2013.01); *H01L 2224/48091* (2013.01); *H01L 2224/48137* (2013.01); *H01L 2224/48464* (2013.01); *H01L 2224/49175* (2013.01)

(58) Field of Classification Search
USPC .......................... 257/693, 701, 718, 719, 726
See application file for complete search history.

(56) References Cited

U.S. PATENT DOCUMENTS 3,539,875 A * 11/1970 Harrington et al. ........... 361/708
3,629,672 A * 12/1971 Van De Water .............. 257/675
6,713,849 B2  3/2004 Hasebe et al.
(Continued)

FOREIGN PATENT DOCUMENTS

JP  64-67949   3/1989
JP  02-106061  4/1990
(Continued)

OTHER PUBLICATIONS

International Search Report issued Mar. 12, 2013 in International (PCT) Application No. PCT/JP2013/000817.

*Primary Examiner* — S. V. Clark
(74) *Attorney, Agent, or Firm* — Wenderoth, Lind & Ponack LLP

(57) ABSTRACT

A resin package includes: a die pad having a main surface on which a semiconductor substrate and a matching circuit substrate is mounted; at least one lead terminal electrically connected to the semiconductor substrate and the matching circuit substrate; a thin plate fixed to at least one of the main surface of the die pad and a main surface of the at least one lead terminal; and molding resin which covers the semiconductor substrate, the matching circuit substrate, and the thin plate.

9 Claims, 13 Drawing Sheets

(51) Int. Cl.
*H01L 23/31* (2006.01)
*H01L 23/13* (2006.01)

(56) References Cited

U.S. PATENT DOCUMENTS

| | | | |
|---|---|---|---|
| 7,518,156 B2 | 4/2009 | Hasebe et al. | |
| 7,911,054 B2 | 3/2011 | Hasebe et al. | |
| 8,044,509 B2 | 10/2011 | Hasebe et al. | |
| 8,367,479 B2 * | 2/2013 | Nakamura et al. | 438/123 |
| 8,420,446 B2 * | 4/2013 | Yo et al. | 438/123 |
| 8,994,159 B2 * | 3/2015 | Nakamura et al. | 257/676 |
| 2002/0084518 A1 | 7/2002 | Hasebe et al. | |
| 2004/0056337 A1 | 3/2004 | Hasebe et al. | |
| 2009/0039486 A1 * | 2/2009 | Shimazaki et al. | 257/676 |
| 2009/0189260 A1 | 7/2009 | Hasebe et al. | |
| 2011/0095412 A1 | 4/2011 | Hasebe et al. | |
| 2012/0007224 A1 | 1/2012 | Hasebe et al. | |
| 2012/0007225 A1 | 1/2012 | Hasebe et al. | |
| 2012/0126265 A1 * | 5/2012 | Hsu et al. | 257/98 |

FOREIGN PATENT DOCUMENTS

| | | |
|---|---|---|
| JP | 10-284658 | 10/1998 |
| JP | 2000-196006 | 7/2000 |
| JP | 2001-024138 | 1/2001 |
| JP | 2005-217003 | 8/2005 |
| JP | 2007-134659 | 5/2007 |
| JP | 2009-094157 | 4/2009 |
| JP | 2009-212542 | 9/2009 |

* cited by examiner

RESIN PACKAGE

TECHNICAL FIELD

The present invention relates to a resin package, and particularly to a resin package for a high frequency power amplifier.

BACKGROUND ART

Resin packages can be mass-produced at a low price, and are, therefore, most widely used as packages for consumer semiconductor devices.

For example, a high frequency power amplifier requires a matching circuit for efficiently inputting/outputting a signal to/from a semiconductor chip, and the matching circuit is often mounted on a die pad together with the semiconductor chip and embedded in a package. Moreover, the resin package is sealed with a resin (resin molding) for the purpose of protecting the semiconductor chip, the matching circuit, other integrated components, and wires for connecting the components (for example, refer to Patent Literature (PTL) 1 to 3).

Moreover, since the above-mentioned semiconductor chip, the matching circuit, etc. are mounted on one pad in the high frequency power amplifier, the size of the die pad (package size) tends to be large. Moreover, the high frequency power amplifier requires high radiation performance due to a large amount of heat generation, and directly radiates the generated heat to housing or a heat sink of an apparatus, and mostly has, therefore, a structure in which the back surface of the die pad is exposed from the resin.

CITATION LIST

Patent Literature

[PTL 1] Japanese Unexamined Patent Application Publication No. 2000-196006
[PTL 2] Japanese Unexamined Patent Application Publication No. 2009-212542
[PTL 3] Japanese Unexamined Patent Application Publication No. 64-67949

SUMMARY OF INVENTION

Technical Problem

Since the high frequency power amplifier generates heat during the use as described above, the molding resin is detached due to a difference in thermal expansion coefficient between members of use (a semiconductor chip, a matching circuit component, a die pad, a lead frame, etc.) and the molding resin when the temperature of the semiconductor chip and the periphery thereof is repeatedly raised and lowered during a long term use. Accordingly, the members adhered to the molding resin are detached from the die pad or a wire is cut off. As a result, the high frequency power amplifier breaks down. Specifically, since the high frequency power amplifier generates a large amount of heat and has a large package size, the problem arises that the detachment of the molding resin significantly occurs.

The present invention was conceived in view of the aforementioned problem and has an object to provide a resin package with great reliability.

Solution to Problem

In order to solve the aforementioned problem, the resin package according to an aspect of the present invention includes: a die pad having a main surface on which a chip is mounted; at least one lead terminal electrically connected to the chip; a thin plate fixed to at least one of the main surface of the die pad and a main surface of the at least one lead terminal; and sealing resin which covers the chip and the thin plate.

Advantageous Effects of Invention

According to the present invention, a resin package with great reliability can be provided.

DESCRIPTION OF EMBODIMENTS

Figure 1:
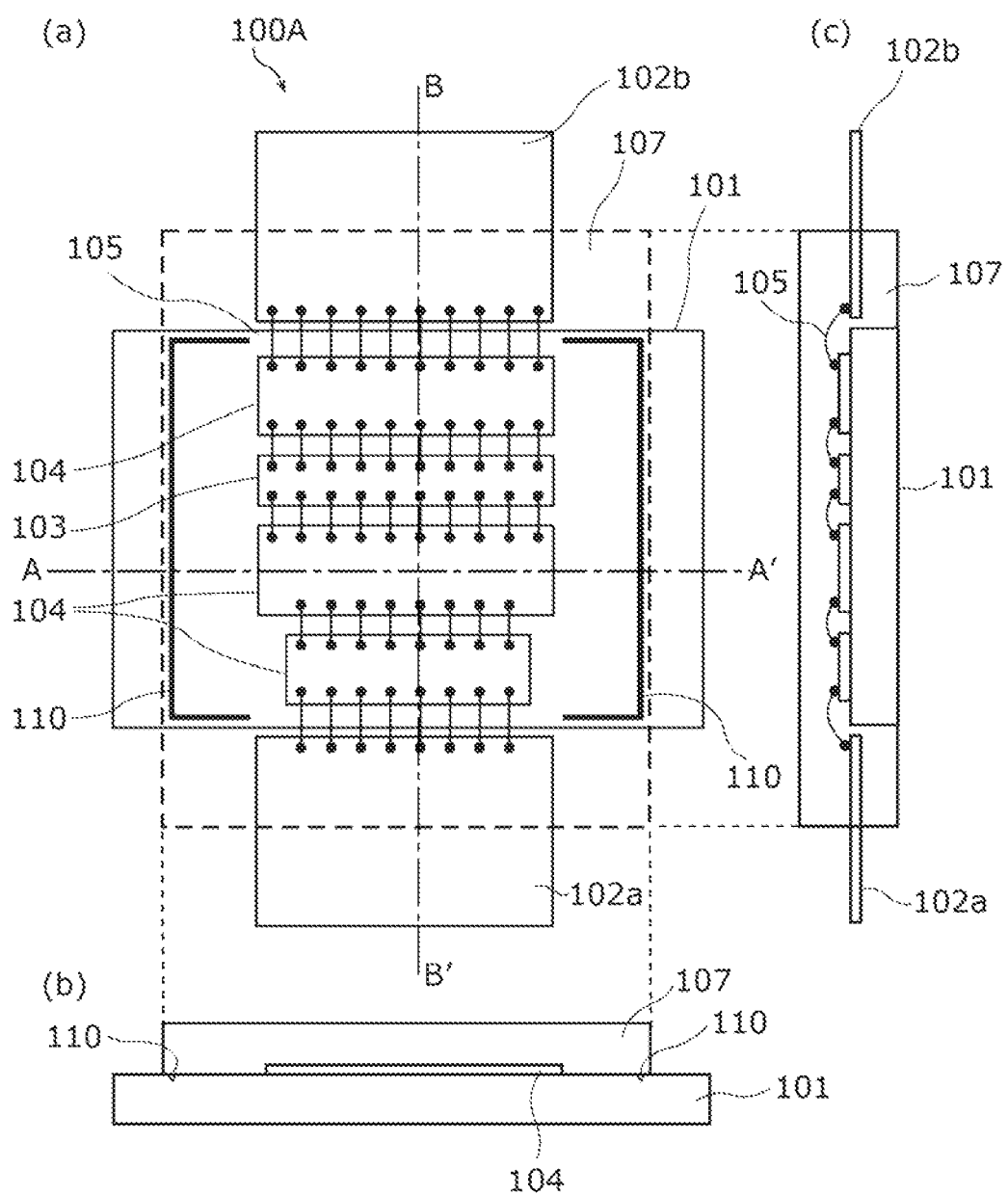
FIG. 1 is a schematic configuration diagram of a resin package for explaining underlying knowledge forming basis of the present invention.

A resin package according to an aspect of the present invention includes: a die pad having a main surface on which a chip is mounted; at least one lead terminal electrically connected to the chip; a thin plate fixed to at least one of the main surface of the die pad and a main surface of the at least one lead terminal; and sealing resin which covers the chip and the thin plate.

With this configuration, since the resin package has the thin plate on at least one of the main surface of the die pad and the main surface of the lead terminal, adhesion between the chip and the sealing resin is increased, thereby providing a resin package from which the sealing resin is less easily detached. With this, a resin package with great reliability (heat resistant of a solder, and long term reliability) can be provided.

Moreover, the thin plate may be positioned around the chip on the main surface of the die pad.

With this configuration, since the thin plate is provided in proximity to the chip, the adhesion between the chip and the sealing resin is increased, thereby providing the resin package from which the sealing resin is much less easily detached.

Moreover, a plurality of the thin plates may be positioned at opposite sides of a region where the chip is mounted on the main surface of the die pad.

With this configuration, since the thin plate is provided at the opposite sides of the region on which the chip is mounted, the adhesion between the chip and the sealing resin is increased, thereby providing the resin package from which the sealing resin is much less easily detached. Moreover, the shape of the thin plate is not limited by the position where the chip is mounted, thereby providing the resin package having broad versatility.

Moreover, it may be that one of the main surface of the die pad and a main surface of the thin plate has a first fixing hole, the other of the main surface of the die pad and the main surface of the thin plate has a first fixing projection, and the first fixing hole and the first fixing projection are engaged with each other.

Moreover, the first fixing hole and the first fixing projection may be crimped.

Moreover, it may be that one of the main surface of the at least one lead terminal and a main surface of the thin plate has a second fixing hole, the other of the main surface of the at least one lead terminal and the main surface of the thin plate has a second fixing projection, and the second fixing hole and the second fixing projection are engaged with each other.

With this configuration, the fixing hole and the fixing projection are engaged with each other, thereby providing the resin package from which the sealing resin is much less easily detached.

Moreover, the second fixing hole and the second fixing projection may be crimped.

With this configuration, the fixing hole and the fixing projection are crimped, thereby providing the resin package from which the sealing resin is much less easily detached.

Moreover, one surface of the thin plate may be roughened.

With this configuration, the one surface of the thin plate is roughened, and the thin plate is fixed to at least one of the die pad and the lead terminal so that the roughened surface is in contact with the sealing resin, thereby providing the resin package from which the sealing resin is much less easily detached.

Moreover, both surfaces of the thin plate may be roughened.

With this configuration, it is possible to obtain the resin package from which the sealing resin is much less easily detached.

Moreover, the surface of the thin plate may be roughened in advance, before the thin plate is attached to the die pad.

With this configuration, it is possible to obtain the resin package from which the sealing resin is much less easily detached.

Moreover, the thin plate may be roughened by forming at least one of grooves or holes.

With this configuration, it is possible to obtain the resin package from which the sealing resin is much less easily detached.

Moreover, the thin plate may have a poorer wettability than the die pad with respect to the die bond material.

With this configuration, the sealing resin easily adheres to the die bonding material, thereby providing the resin package from which the sealing resin is much less easily detached.

(Underlying Knowledge Forming Basis of the Present Invention)

Figure 2:
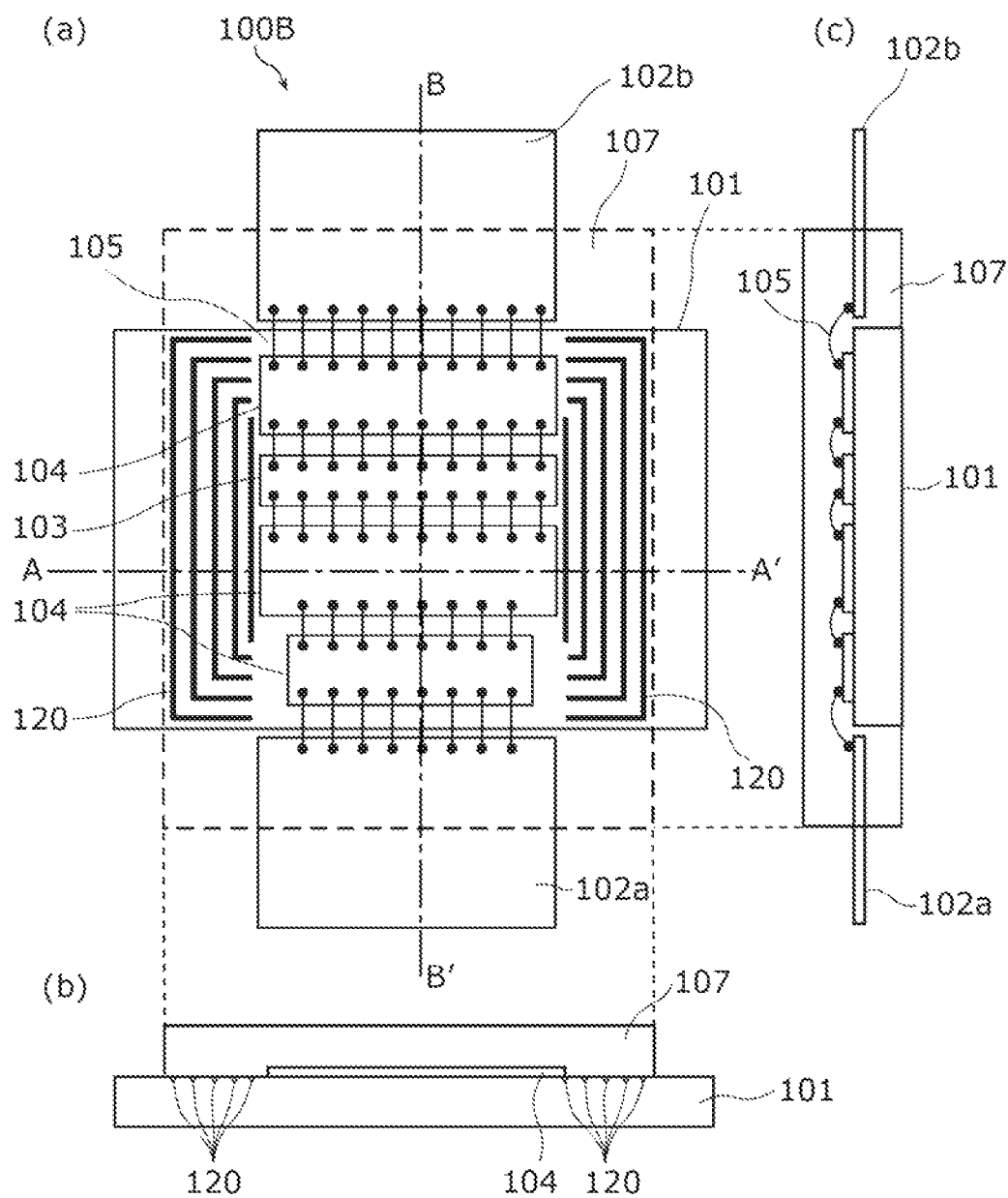
FIG. 2 is a schematic configuration diagram of a resin package for explaining underlying knowledge forming basis of the present invention.
Figure 3:
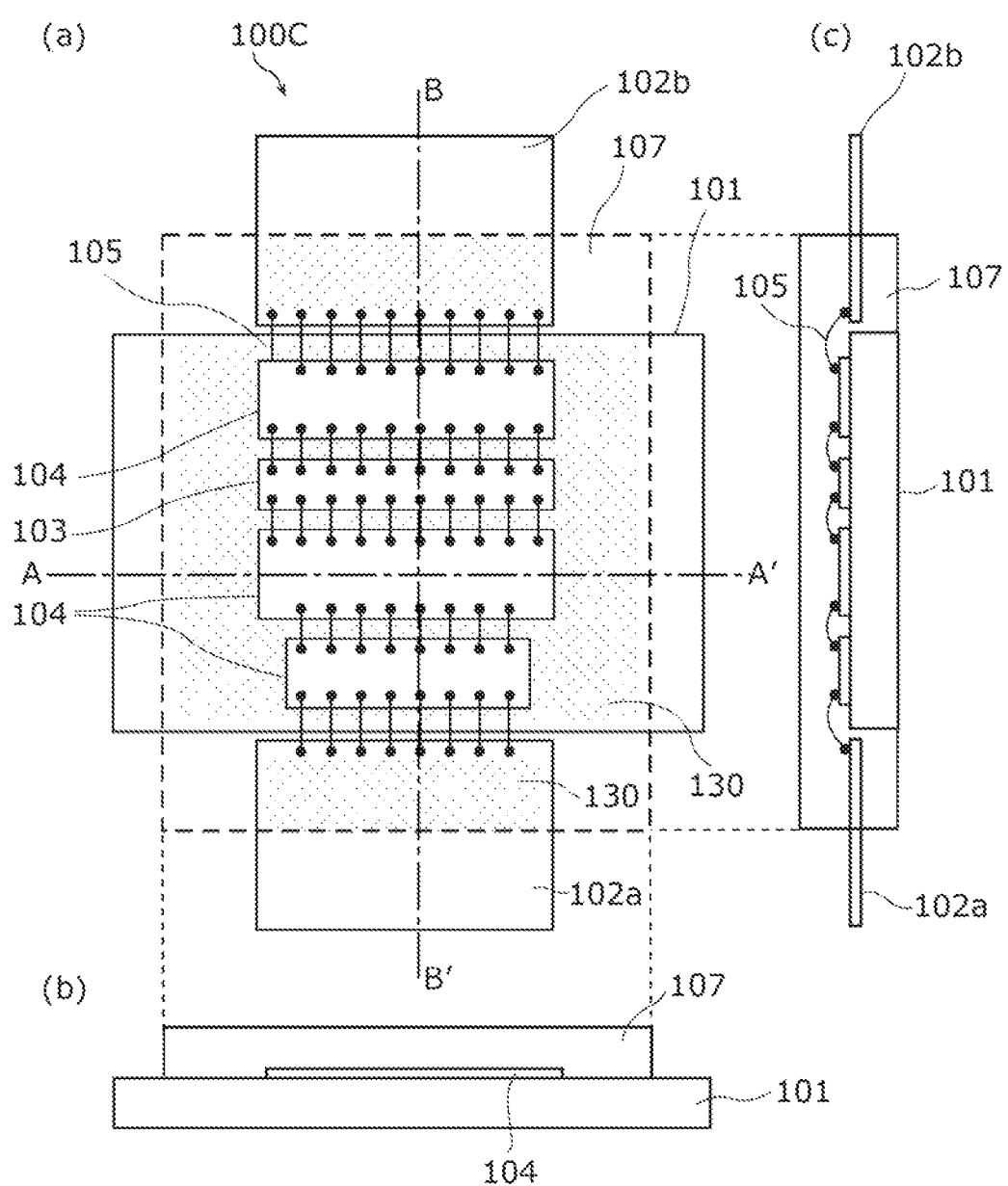
FIG. 3 is a schematic configuration diagram of a resin package for explaining underlying knowledge forming basis of the present invention.

First, underlying knowledge forming basis of the present invention is described. FIGS. 1 to 3 are schematic diagrams of the resin package for explaining the underlying knowledge forming basis of the present invention. Each of resin packages 100A, 100B, and 100C shown in FIGS. 1 to 3 includes: a die pad 101; plural lead terminals 102a and 102b; a semiconductor device 103 bonded on the die pad 101 through die bonding; a matching circuit substrate 104; a bonding wire 105 for connecting the matching circuit substrate 104, the semiconductor device 103, and inner lead portions of the lead terminals 102a and 102b; and a molding resin 107.

As described above, a high frequency power amplifier generates a large amount of heat and has a large package size, so that a problem is caused that the detachment of the molding resin significantly occurs.

In view of such a problem, a resin package disclosed in PTL 1 has a structure to ensure adhesion between a die pad and a molding resin by engaging a sealing resin with plural projections having T-shaped ends formed around the die pad, thereby increasing the adhesion between the die pad and the molding resin around the engaged portions. However, even with such a technique, it is difficult to increase adhesion between the entire surface of the die pad and the molding resin, which is more significant specifically in a resin package having a large die pad surface area.

In PTL 2, adhesion between a die pad and a resin is increased by forming a groove surrounding components on a die pad to enlarge the adhesion area.

More specifically, as shown in FIG. 1, the resin package 100A has a V-groove 110 surrounding the mounted components such as the semiconductor device 103 and the matching circuit substrate 104, on a surface of the die pad 101. Accordingly, the adhesion area between the die pad 101 and the molding resin 107 is enlarged by providing the V-groove 110, thereby increasing the adhesion between the die pad 101 and the molding resin 107.

In this case, although the V-groove 110 formed only in the vicinity of the circumference of the die pad 101 increases the adhesion in the vicinity of the circumference of the semiconductor device 103 and the matching circuit substrate 104, it is difficult to increase adhesion between the entire surface of the die pad and the resin.

Moreover, in the resin package 100B as shown in FIG. 2, plural V-grooves 120 provided close to the mounted components are effective for improving the adhesion, but the positions of the V-grooves 120 are determined according to the size of the mounted components etc., so that the lead frame loses versatility, resulting in a significant increase in a cost. Moreover, when the V-grooves 120 are selectively formed in a post process after forming the lead frame, a further significant increase in a cost is caused due to an increase in the number of processes.

Moreover, in PTL 3, a roughened region 130 is formed which is a region where the entire surface or a selected part of the lead frame is roughened in the post process. In the case where the entire surface is roughened, the portions of the semiconductor device 103 and the matching circuit substrate 104 are also roughened, thereby preventing eutectic caused between the die bonding material, and the semiconductor device 103 and the matching circuit substrate 104. Moreover, the lead terminals 102a and 102b are also roughened, so that good connection of the bonding wire 105 is disturbed. Moreover, in the resin package 100C as shown in FIG. 3, a masking process is required for selectively avoiding a region on which the semiconductor device 103, the matching circuit substrate 104, and others are mounted for the roughening through chemical processing using chemicals and physical processing such as sandblasting, resulting in a significant increase in a cost.

In view of the aforementioned knowledge, a description is given of a low-cost and highly reliable (heat resistant of a solder, and long term reliability) resin package.

Embodiment 1

Hereinafter, a resin package in Embodiment 1 according to an aspect of the present invention is described with reference to the drawings.

Figure 4:
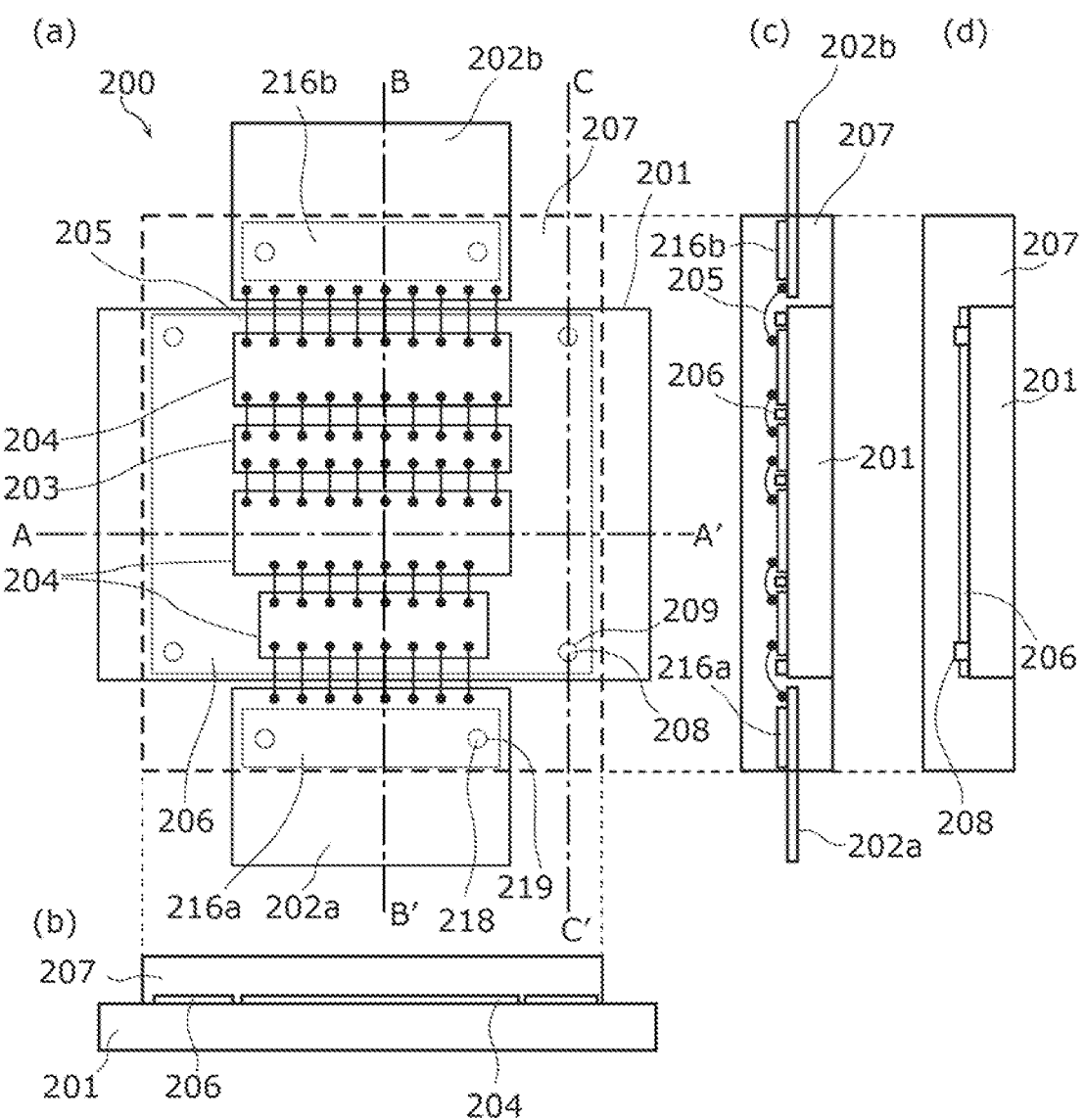
FIG. 4 is a schematic configuration diagram of a resin package according to Embodiment 1.

FIG. 4 is a schematic configuration diagram showing a resin package 200 according to this embodiment; (a) is a top view of the resin package 200, (b) is a cross sectional view of (a) along the line AA', (c) is a cross sectional view of (a) along the line BB', and (d) is a cross sectional view of (a) along the line CC'.

As shown in (a) in FIG. 4, the resin package 200 includes a die pad 201, lead terminals 202a and 202b, a semiconductor device 203, a matching circuit substrate 204, a bonding wire 205, a thin plate 206, thin plates 216a and 216b, and a molding resin 207. It is to be noted that (a) in FIG. 4 is a top view in which the molding resin 207 is seen through, and only the outer frame of the molding resin 207 is indicated by a dotted line. Moreover, the semiconductor device 203 and the matching circuit substrate 204 correspond to chips in the present invention. The molding resin 207 corresponds to a sealing resin in the present invention.

The die pad 201 is a substrate on which the semiconductor device 203 and the matching circuit substrate 204 are mounted, and has a plate shape and a thickness of approximately 1 mm as shown in (b) to (d) in FIG. 4. On a main surface of the die pad 201, the semiconductor device 203 and the matching circuit substrate 204 are mounted. Moreover, the main surface of the die pad 201 has a fixing projection 208 for fixing the thin plate 206 that is described later. It is to be noted that the fixing projection 208 corresponds to a first fixing projection in the present invention.

Moreover, the lead terminals 202a and 202b are positioned outside of the die pad 201 facing to each other across the die pad 201. The lead terminals 202a and 202b have a plate shape and a thickness of approximately 0.1 mm as shown in (b) to (d) in FIG. 4. Moreover, the lead terminals 202a and 202b have respective fixing projections 218 for fixing the thin plates 216a and 216b described later. It is to be noted that the fixing projections 218 each corresponds to a second fixing projection in the present invention.

The die pad 201 and the lead terminals 202a and 202b are made of a material having low electric resistance and high thermal conductivity such as copper.

The thin plate 206 is fixed to a portion of the main surface of the die pad 201 other than the portion on which the semiconductor device 203 and the matching circuit substrate 204 are mounted. In other words, the thin plate 206 is positioned around the semiconductor device 203 and the matching circuit substrate 204 on the die pad 201. The thin plate 206 has a fixing hole 209 for being fixed to the die pad 201, and the fixing projection 208 of the die pad 201 is engaged with the fixing hole 209. It is to be noted that the fixing hole 209 corresponds to a first fixing hole in the present invention.

The thin plates 216a and 216b are fixed to the main surfaces of the lead terminals 202a and 202b. The thin plates 216a and 216b have respective fixing holes 219 for being fixed to the lead terminals 202a and 202b, and fixing projections 218 of the lead terminals 202a and 202b are engaged with the corresponding fixing holes 219. It is to be noted that a fixing hole 219 corresponds to a second fixing hole in the present invention.

The thin plates 206, 216a, and 216b are made of metal such as copper and brass. Moreover, the both surfaces of each of the thin plates 206, 216a, and 216b are roughened entirely in advance through, for example, chemical processing using chemicals and physical processing such as sandblasting.

The bonding wire 205 is an inner lead for electrically connecting the semiconductor device 203, the matching circuit substrate 204, and the lead terminals 202a and 202b. Bonding wires 205 are bonded to, for example, adjacent ones of the semiconductor device 203, the matching circuit substrate 204, and the lead terminals 202a and 202b as shown in (b) to (d) in FIG. 4. The bonding wire 205 is made of, for example, gold, aluminum, or copper.

The molding resin 207 is an epoxy resin, for example, and formed to cover at least the semiconductor device 203 and the matching circuit substrate 204 which are mounted on the die pad 201, the bonding wire 205, a thin plate 206 fixed on the die pad 201, and the thin plates 216a and 216b fixed on the lead terminals 202a and 202b as shown in (b) to (d) in FIG. 4.

At this time, as shown in (c) in FIG. 4, a part of the main surface and a part of the back surface of the lead terminals 202a and 202b are in the molding resin 207. Moreover, the semiconductor device 203, the matching circuit substrate 204, the bonding wire 205, a thin plate 206, and the thin plates 216a and 216b are in close contact with the molding resin 207.

At least a part of the main surface and a part of the side surface of the die pad 201 are in close contact with the molding resin 207. Moreover, the back surface of the die pad 201 is not contact with the molding resin 207. Here, the exposed back surface of the die pad 201 is fixed to a heat sink etc. with a screw or soldering.

Generally, a material for the molding resin 207 is, for example, an epoxy resin. As a result, the molding resin 207 has thermal conductivity lower than that of a metal material such as copper by more than two orders. Therefore, in heat radiation through the molding resin 207, it is difficult to effectively radiate the heat generated by the semiconductor device 203 at a high-power output. However, by fixing the exposed back surface of the die pad 201 to the heat sink etc. with a screw or soldering, the resin package 200 can effectively radiate the heat generated by the semiconductor device 203 to the heat sink etc.

FIGS. 5 to 8 are diagrams showing processes of manufacturing the resin package 200 according to this embodiment. In each of FIGS. 5 to 8, (a) is a cross sectional view of the resin package 200 in each process, and (b) is a top view. It is to be noted that (a) is a cross sectional view of (b) along the line BB'. The same reference numerals are assigned to the same structural elements as those in FIG. 4, and the descriptions thereof are omitted.

Here, for example, a process to form four resin packages 200 at once is described.

Figure 5:
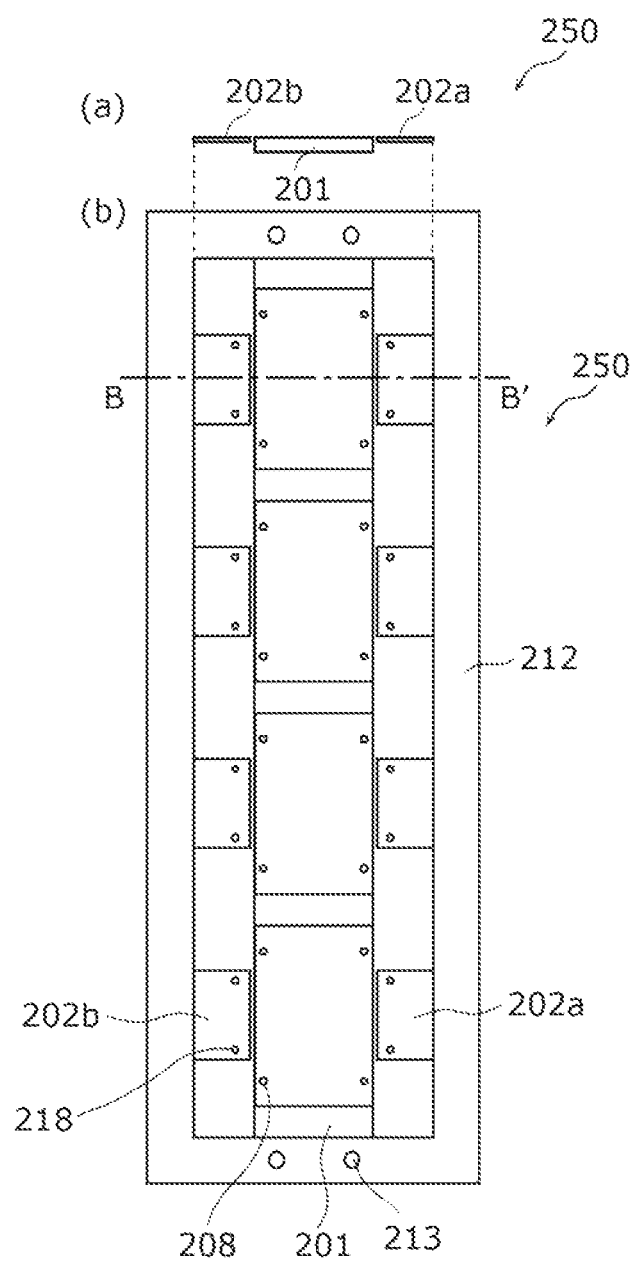
FIG. 5 is a diagram showing a process of manufacturing the resin package according to Embodiment 1.

A process of manufacturing the lead frame 250 in the resin package 200 is shown in (a) and (b) in FIG. 5. The lead frame is, in general, a component that supports and fixes a semiconductor device (semiconductor chip), and for a connection with external wiring. In this embodiment, the lead frame 250 includes the die pad 201, the lead terminal 202a and 202b, and a lead portion 212.

More specifically, the lead frame 250 includes the die pad 201 that is a copper base plate made of an oxygen-free copper etc., having a thickness of approximately 1 mm, the lead terminals 202a and 202b having a thickness of approximately 0.1 mm, and the lead portion 212. The lead terminals 202a and 202b, and the lead portion 212 are formed by punching the copper base plate made of an oxygen-free copper using a die having a predetermined shape. The die pad 201 is crimped to the lead portion 212 by a crimp portion 213. Moreover, the surface of the lead frame 250 is gold-plated for the purpose of increasing connectivity, which is obtained through die bonding described later, with the semiconductor device 203 and the matching circuit substrate 204. It is to be noted that, in general, heat expands from the semiconductor device 203 at an angle of 45 degrees to the depth direction of the die pad 201. In order to effectively radiate the heat generated by the semiconductor device 203 having a high-power output, the die pad 201 is required to have a thickness of more than or equal to 0.5 mm to sufficiently expand the heat generated by the semiconductor device 203.

Figure 6:
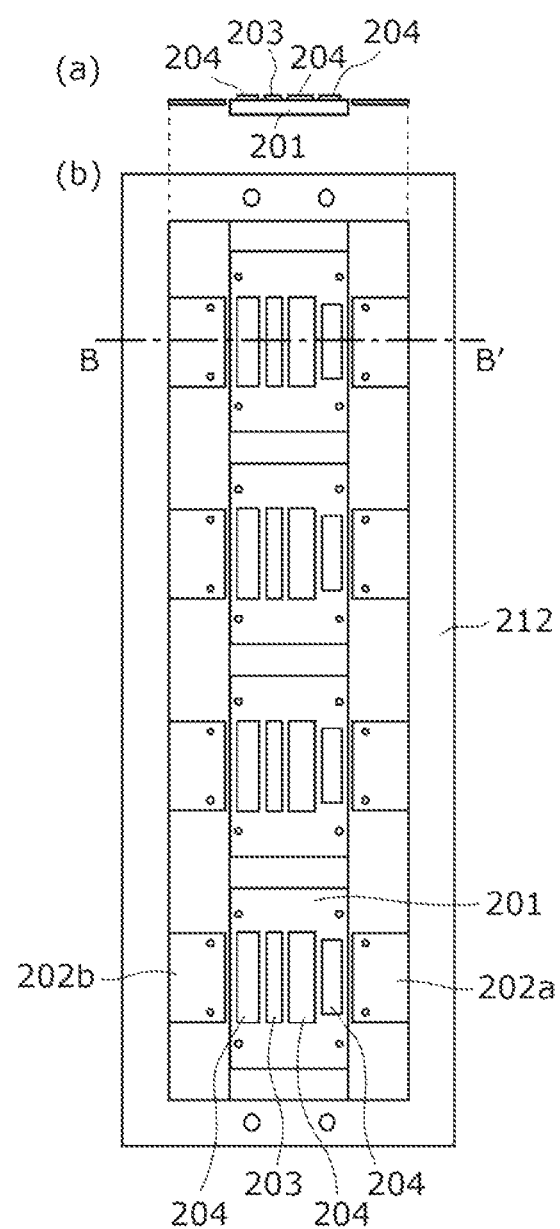
FIG. 6 is a diagram showing a process of manufacturing the resin package according to Embodiment 1.

In (a) and (b) in FIG. 6, processes of die bonding for bonding the semiconductor device 203 and the matching circuit substrate 204 to the die pad 201 are shown. The surface of the lead frame 250 (obtained by crimping the die pad 201 and the lead portion 212) is gold-plated. In the resin package 200, the die bonding uses a die bonding material having high heat conductivity such as mixed crystal including AuSi or AuSn in order to secure a sufficient connection between the semiconductor device 203 and the die pad 201, and to efficiently radiate the heat. For example, the die bonding is performed by placing an AuSn pellet on a target region where the semiconductor device 203 and the matching circuit substrate 204 are bonded through the die bonding on the lead frame 250, placing the semiconductor device 203 and the matching circuit substrate 204 thereon, and heating the region.

It is to be noted that since gold has low adhesion with respect to resin, some method for increasing the adhesion is required for increasing the adhesion between the gold-plated die pad 201 and the lead terminals 202a and 202b, and the molding resin 207. Therefore, as described below, the thin plates 206, 216a, and 216b are disposed on the main surfaces of the die pad 201, the lead terminal 202a, and the lead terminal 202b, respectively.

Figure 7:
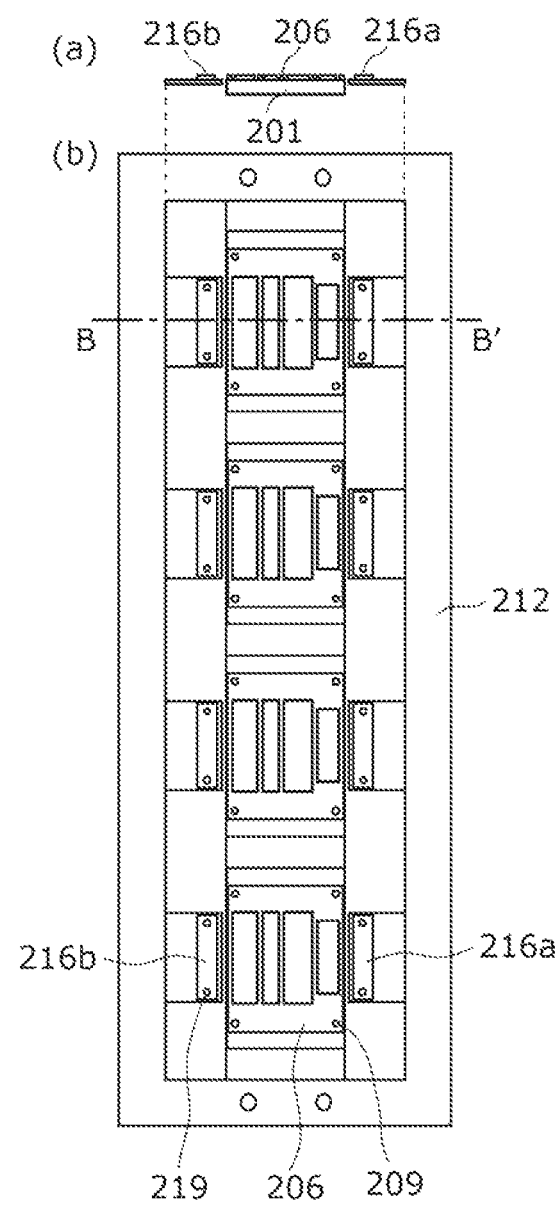
FIG. 7 is a diagram showing a process of manufacturing the resin package according to Embodiment 1.

In (a) and (b) in FIG. 7, the resin package 200 is shown in a state after the semiconductor device 203 and the matching circuit substrate 204 are bonded on the die pad 201 through die bonding, the thin plate 206 is placed on the die pad 201, and the thin plates 216a and 216b are placed on the lead terminals 202a and 202b in the lead frame 250, respectively.

The thin plate 206 has an opening. The opening has a shape similar to the outer shape of the semiconductor device 203 and the matching circuit substrate 204. The thin plate 206 is disposed on the die pad 201 so as to place the semiconductor device 203 and the matching circuit substrate 204 in the opening of the thin plate 206. At this time, the fixing projection 208 that is provided for the die pad 201 in advance and the fixing hole 209 provided for the thin plate 206 are engaged with each other. With this, the thin plate 206 can be firmly fixed to the die pad 201.

Moreover, the thin plates 216a and 216b are also disposed on the lead terminals 202a and 202b. At this time, the fixing projections 218 that are provided for the lead terminals 202a and 202b in advance and the fixing holes 209 provided for the thin plates 216a and 216b are engaged with each other. With this, the thin plates 216a and 216b can be firmly fixed to the lead terminals 202a and 202b.

By firmly fixing the thin plates 206, 216a, and 216b to the die pad 201 and the lead terminals 202a and 202b, it is possible, for example, to prevent the bonding wire 205 from being cut or the semiconductor device 203 and the matching circuit substrate 204 from being damaged as a result of the thin plate 206 being moved in a mold when the mold is moved around the die pad 201 and the lead terminals 202a and 202b at the time of resin molding.

Figure 8:
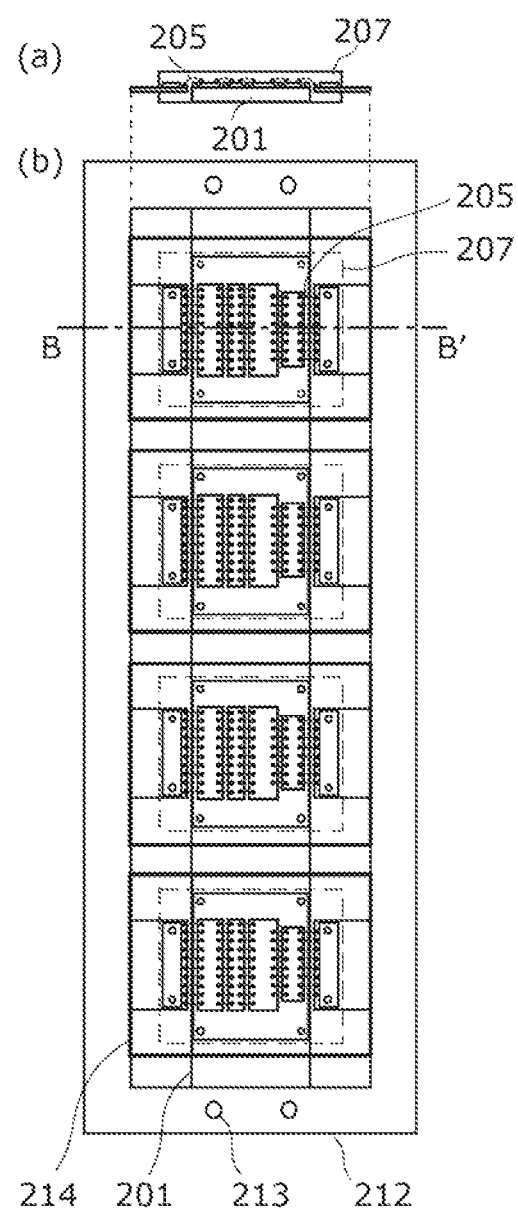
FIG. 8 is a diagram showing a process of manufacturing the resin package according to Embodiment 1.

In (a) and (b) in FIG. 8, the resin package 200 is shown in a state after the resin molding is performed using the molding resin 207, following wire bonding (as to the molding resin 207, only the outer circumference is shown). The molding resin 207 is formed to cover at least the semiconductor device 203 and the matching circuit substrate 204 mounted on the die pad 201, the bonding wire 205, the thin plate 206 fixed on the die pad 201, and the thin plates 216a and 216b fixed on the lead terminals 202a and 202b.

Subsequently, pieces of the resin package 200 are completed by performing tie-bar cutting to separate the resin package 200 into regions 214. Accordingly, when the molding resin 207 is divided, it is possible to closely attach the roughened thin plate 206 to the molding resin 207, and prevent the die pad 201 from being detached from the molding resin 207.

The resin package 200 according to this embodiment as described above has the thin plates 206, 216a, and 216b on at least one of the main surfaces of the die pad 201 and the lead terminals 202a and 202b, thereby providing the resin package 200 from which the molding resin is not easily detached due to high adhesion between the molding resin 207 and the thin plates 206, 216a, and 216b. With this, a resin package with great reliability (heat resistant of a solder, and long term reliability) can be provided.

It is to be noted that the above description is an example of the resin package 200 in which the back surface of the die pad 201 is exposed, but without the exposure, the same advantage as that of the resin package 200 according to this embodiment can naturally be obtained. In the case where the back surface of the die pad 201 is exposed, a resin interface, that is, the main surface of the die pad 201 is easily influenced by a change in temperature caused by a reflow or a surrounding environment, the advantage of this embodiment is enhanced.

It is to be noted that a through hole in the thin plate 206 increases the adhesion between the thin plate 206 and the molding resin 207, thereby effectively preventing the molding resin 207 from being detached from the die pad 201 or the lead terminals 202a and 202b. That is to say, the roughening of the above thin plates 206, 216a and 216b may be performed in the form of providing through holes for the thin plates 206, 216a and 216b. Moreover, the roughening of the above thin plates 206, 216a and 216b may be performed in the form of providing grooves for the thin plates 206, 216a and 216b.

Moreover, although the above description is an example of the resin package 200 in which the both surfaces of each of the thin plates 206, 216a and 216b are roughened entirely, the case of using the thin plates 206, 216a and 216b which are not roughened also provides the advantage of the present application. Moreover, only one surface of each of the thin plates 206, 216a and 216b may be roughened. In the case of using the thin plates 206, 216a and 216b only one surface of each of which is roughened, the thin plates 206, 216a and 216b are preferably fixed to the die pad 201 and the lead terminals 202a and 202b, respectively, such that the roughened surfaces are in contact with the molding resin 207. The roughening of thin plates 206, 216a and 216b increases the adhesion between the molding resin 207 and the thin plates 206, 216a and 216b; thereby further effectively preventing the molding resin 207 from being detached from the die pad 201 when the molding resin is divided.

Moreover, although the fixing projections 208 and 218 are engaged with the fixing holes 209 and 219 in the above resin package 200, respectively, the fixing projections 208 and 218 may be crimped to the fixing holes 209 and 219, respectively. Here, the crimping means that after engaging the fixing holes 209 and 219 with the fixing projections 208 and 218, respectively, crushing the ends of the fixing projections 208 and 218 to firmly connect the fixing holes and the corresponding fixing projections. As described above, by firmly fixing the thin plates 206, 216a, and 216b to the die pad 201 and the lead terminals 202a and 202b, it is possible, for example, to prevent the bonding wire 205 from being cut or the semiconductor device 203 and the matching circuit substrate 204 from being damaged as a result of the thin plate 206 being moved in a mold when the mold is moved around the die pad 201 and the lead terminals 202a and 202b at the time of the resin molding.

Variation of Embodiment 1

Next, a variation of Embodiment 1 is described.

FIGS. 9 to 12 are diagrams showing processes of manufacturing a resin package 200 according to the variation of Embodiment 1. In each of FIGS. 9 to 12, (a) is a cross sectional view of the resin package 200 in each process, and (b) is a top view. It is to be noted that (a) is a cross sectional view of (b) along the line BB'. The same reference numerals are assigned to the same structural elements as those in FIG. 4 according to Embodiment 1, and the descriptions thereof are omitted.

The resin package 200 according to this variation is different from the resin package 200 in that, in the manufacturing process, the thin plate 206 is fixed to the die pad 201 before the semiconductor device 203 and the matching circuit substrate 204 are mounted on the die pad 201.

Here, for example, a process to form four resin packages 200 at once is described.

Figure 9:
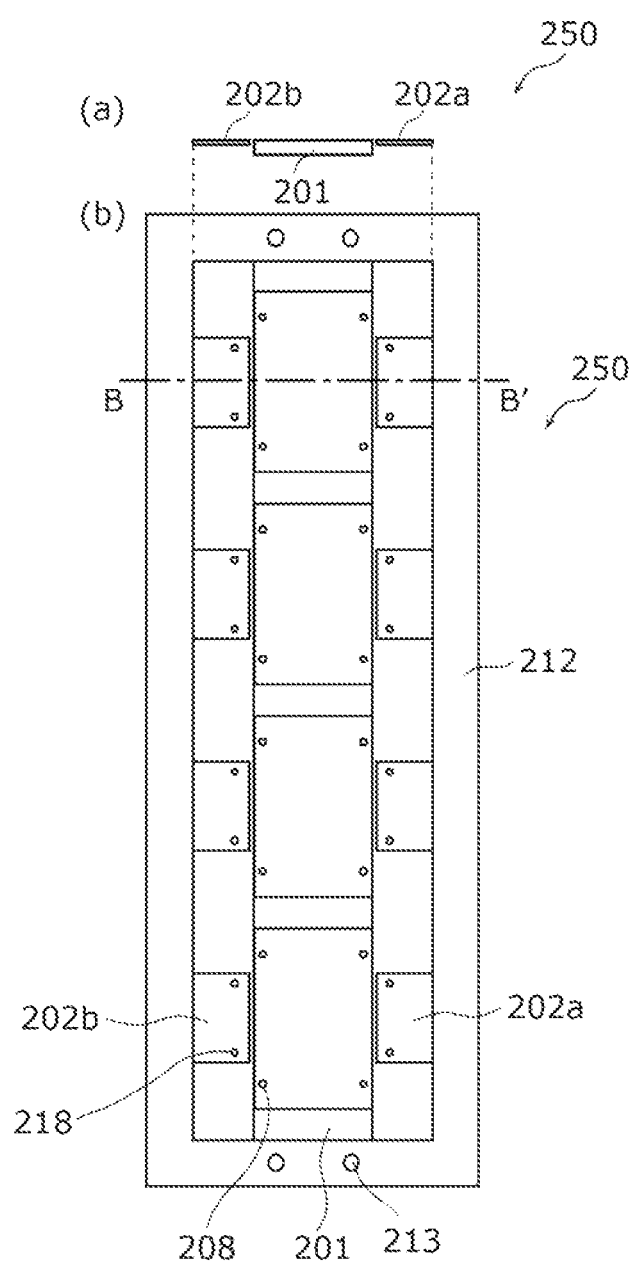
FIG. 9 is a diagram showing a process of manufacturing a resin package according to a variation of Embodiment 1.

In (a) and (b) in FIG. 9, a process of manufacturing the lead frame 250 in the resin package 200 is shown. Since this process is the same as the process shown in (a) and (b) in FIG. 5, the descriptions are omitted.

Figure 10:
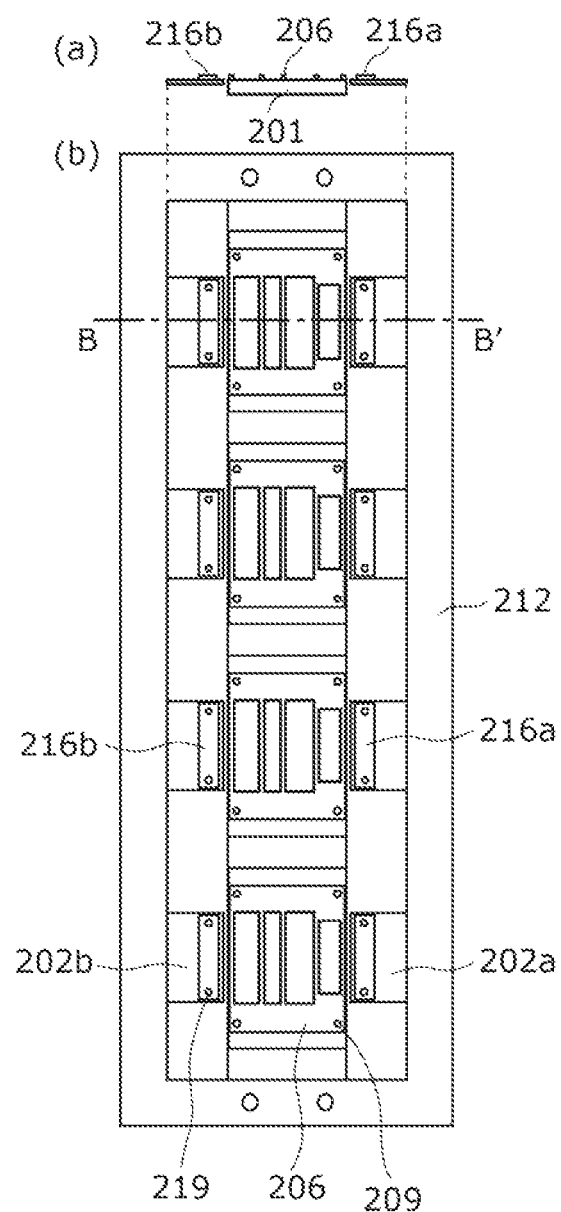
FIG. 10 is a diagram showing a process of manufacturing the resin package according to the variation of Embodiment 1.

In (a) and (b) in FIG. 10, a process of manufacturing the resin package 200 is shown in a state in which the thin plate 206 is disposed on the die pad 201 in the lead frame 250, and the thin plates 216a and 216b are disposed on the lead terminals 202a and 202b in the lead frame 250. The thin plate 206 has an opening. The opening has a shape similar to the outer shape of the semiconductor device 203 and the matching circuit substrate 204. Before bonding the semiconductor device 203 and the matching circuit substrate 204 to the die pad 201 through the die bonding, the thin plate 206 is fixed to the die pad 201. At this time, the fixing projection 208 that is provided for the die pad 201 in advance and the fixing hole 209 provided for the thin plate 206 are engaged with each other. With this, the thin plate 206 can be firmly fixed to the die pad 201.

With this, accuracy is increased in the alignment of the semiconductor device 203 and the matching circuit substrate 204.

Moreover, the thin plates 216a and 216b are disposed on the lead terminals 202a and 202b as in Embodiment 1. At this time, the fixing projections 218 that are provided for the lead terminals 202a and 202b in advance and the fixing holes 209 provided for the thin plates 216a and 216b are engaged with each other. With this, the thin plates 216a and 216b can be firmly fixed to the lead terminals 202a and 202b.

Figure 11:
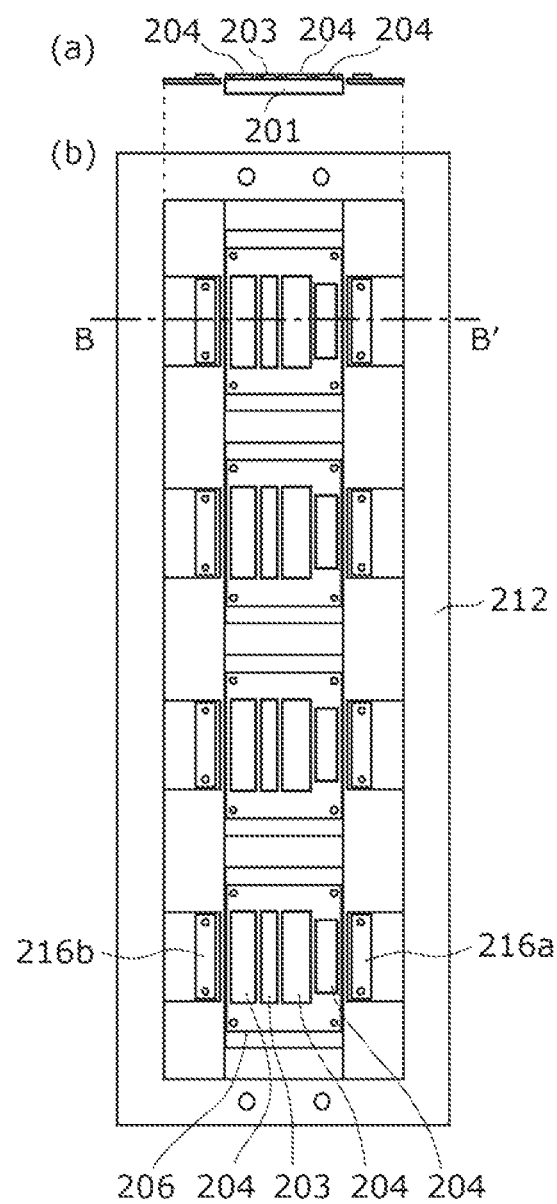
FIG. 11 is a diagram showing a process of manufacturing the resin package according to the variation of Embodiment 1.

In (a) and (b) in FIG. 11, processes of die bonding for bonding the semiconductor device 203 and the matching circuit substrate 204 to the die pad 201 are shown. The surface of the lead frame 250 (obtained by crimping the die pad 201 and the lead portion 212) is gold-plated. In the resin package 200, the die bonding uses a die bonding material having high heat conductivity such as mixed crystal including AuSi or AuSn in order to secure a sufficient connection between the semiconductor device 203 and the die pad 201, and to efficiently radiate the heat. For example, the die bonding is performed by placing an AuSn pellet on a target region where the semiconductor device 203 and the matching circuit substrate 204 are bonded through the die bonding on the lead frame 250, placing the semiconductor device 203 and the matching circuit substrate 204 thereon, and heating the region. The target region where the semiconductor device 203 and the matching circuit substrate 204 are bonded through the die bonding is in an opening formed in the thin plate 206.

Figure 12:
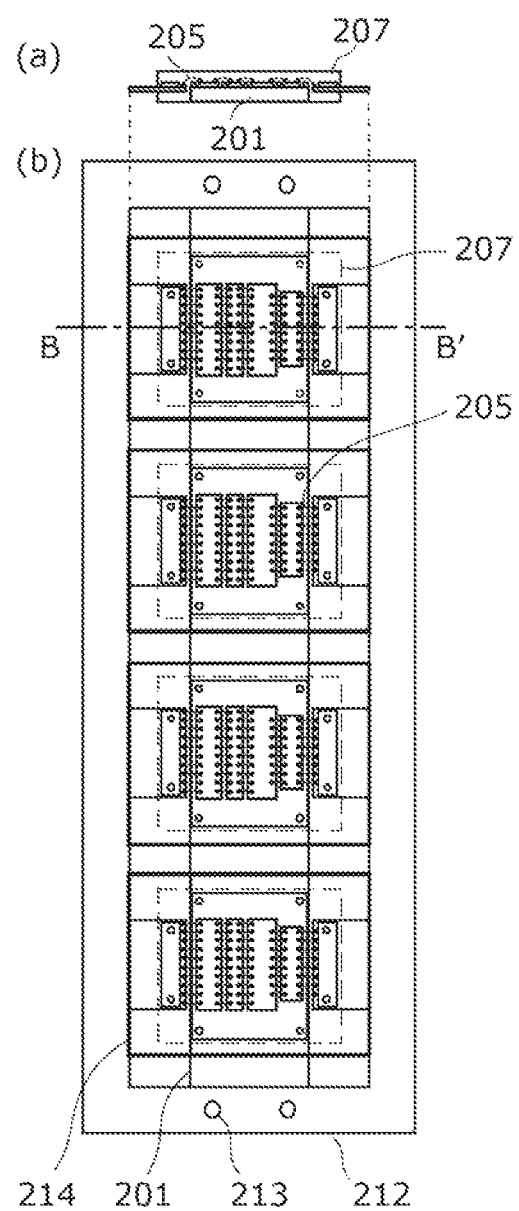
FIG. 12 is a diagram showing a process of manufacturing the resin package according to the variation of Embodiment 1.

In (a) and (b) in FIG. 12, the resin package 200 is shown in a state after the resin molding is performed using the molding resin 207, following a wire bonding. Since this process is the same as the process shown in (a) and (b) in FIG. 8, the descriptions are omitted.

Subsequently, pieces of the resin package 200 are completed by performing tie-bar cutting to separate the resin package 200 into regions 214. Accordingly, it is possible to closely attach the roughened thin plate 206 to the molding resin 207, and prevent the die pad 201 from being detached from the molding resin 207 when the molding resin 207 is divided.

According to this variation as described above, the resin package 200 has the thin plates 206, 216a, and 216b on at least one of the main surface of the die pad 201 and the main surfaces of the lead terminals 202a and 202b, thereby providing the resin package from which the molding resin 207 is not easily detached due to increased adhesion between the molding resin 207, and the semiconductor device 203 and the matching circuit substrate 204. With this, the resin package 200 with great reliability (heat resistant of a solder, and long term reliability) can be provided.

Furthermore, by fixing the thin plate 206 to the main surface of the die pad 201 prior to the semiconductor device 203 and the matching circuit substrate 204, the semiconductor device 203 and the matching circuit substrate 204 can be disposed at a predetermined position on the main surface of the die pad 201 with great accuracy.

It is to be noted that the thin plates 206, 216a, and 216b may be roughened in advance, before fixed to the die pad 201 and the lead terminals 202a and 202b, or may be roughened before the semiconductor device 203 and the matching circuit substrate 204 are mounted after the thin plates 206, 216a, and 216b are fixed to the die pad 201 and the lead terminals 202a and 202b. In this case, the thin plates 206, 216a, and 216b may be roughened, for example, through physical processing such as sandblasting after fixed to the die pad 201 and the lead terminals 202a and 202b.

It is to be noted that the crimping between the fixing projection 208 provided for the die pad 201 and the fixing hole 209 provided for thin plate 206 can prevent misalignment of the die pad 201 and the thin plate 206 at the time when the semiconductor device 203 and the matching circuit substrate 204 are mounted on the die pad 201. Furthermore, the molding resin 207 is further fixed by fixing the thin plate 206 to the die pad 201, thereby suppressing detachment of the molding resin 207.

Moreover, the thin plate 206 may be fixed to the die pad 201 by a method other than crimping (may be fixed using a die bonding material or adhesive). Furthermore, the molding resin 207 may be divided to increase a contact area between the die pad 201 and the thin plate 206 so that the detachment of the molding resin 207 is suppressed.

Furthermore, SUS which has a poorer wettability with respect to the die bonding material, or the thin plate 206 which is made of the same resin as the molding resin 207 may be used. With this, it is possible to avoid a shortage of a die bonding material as a result of the die bonding material being attached to the thin plate 206, or a failure in die bonding caused by the die bonding material being blown up into the opening of the thin plate.

At this time, use of a pellet-type die bonding material that is larger than the opening of the thin plate 206 results in that the thin plate 206 can hold the pellet, so that it is possible to avoid a failure in mounting in which the semiconductor device 203 and the matching circuit substrate 204 are detached due to bending and folding of the pellet.

Embodiment 2

The following describes Embodiment 2. A resin package according to this embodiment is different from the resin package described in Embodiment 1 in that thin plates are disposed at the opposite sides of a region on which chips (a semiconductor device and a matching circuit substrate) are mounted on the main surface of a die pad. Hereinafter, a description is given with reference to FIG. 13.

Figure 13:
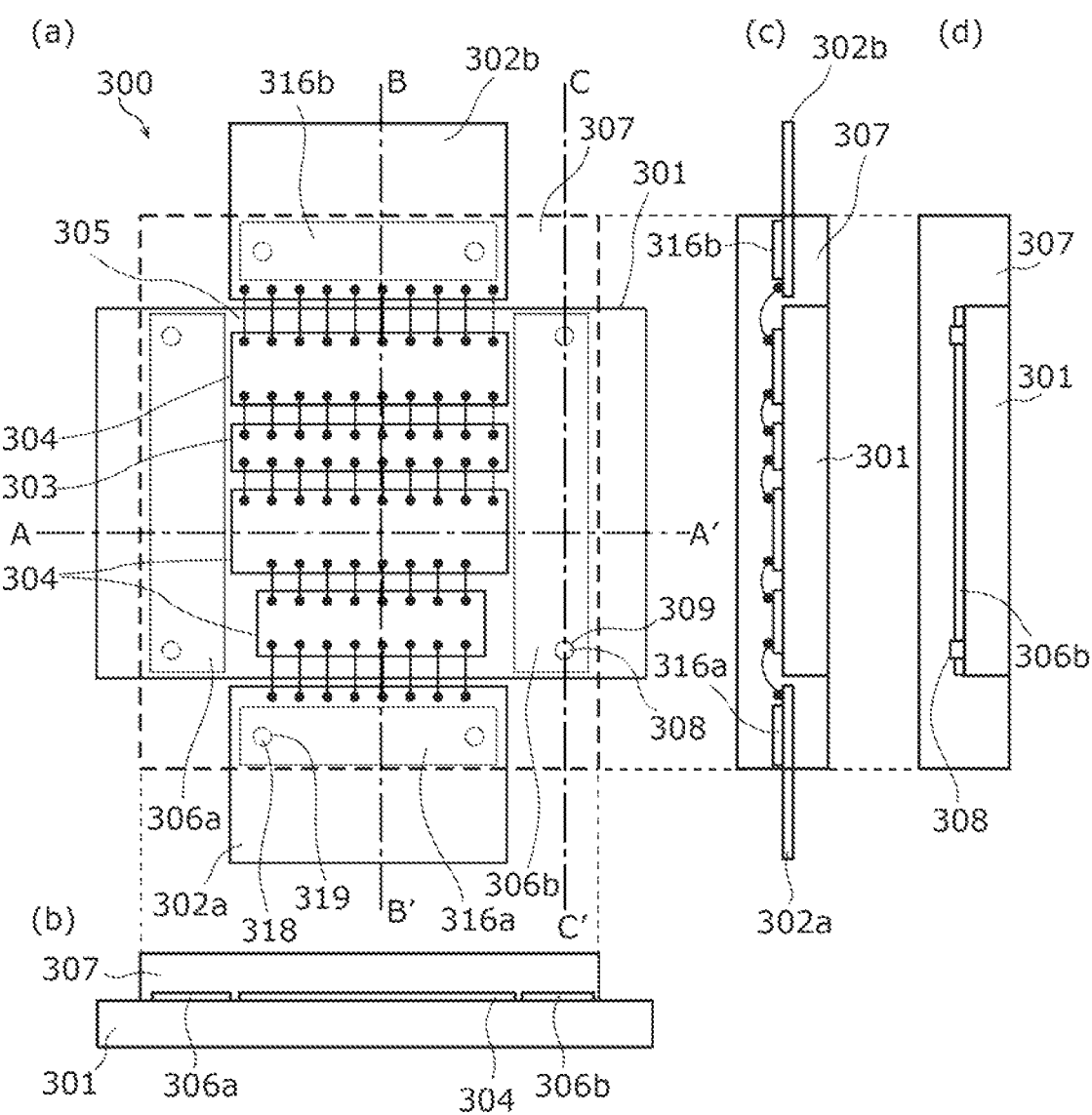
FIG. 13 is a schematic configuration diagram of a resin package according to Embodiment 2.

FIG. 13 is a schematic configuration diagram showing a resin package according to this embodiment; (a) is a top view of the resin package, (b) is a cross sectional view of (a) along the line AA, (c) is a cross sectional view of (a) along the line BB', and (d) is a cross sectional view of (a) along the line CC'.

As shown in (a) in FIG. 13, a resin package 300 includes a die pad 301, lead terminals 302*a* and 302*b*, a semiconductor device 303, a matching circuit substrate 304, a bonding wire 305, thin plates 306*a* and 306*b*, thin plates 316*a* and 316*b*, and a molding resin 307. Respective fixing holes 319 for being fixed to the lead terminals 302*a* and 302*b* are provided for the thin plates 316*a* and 316*b*, and respective fixing projections 318 of the lead terminals 302*a* and 302*b* are engaged with the corresponding fixing holes 319. It is to be noted that (a) in FIG. 13 is a top view in which the molding resin 307 is seen through, and only the outer frame of the molding resin 307 is indicated by a dotted line. Moreover, the semiconductor device 303 and the matching circuit substrate 304 correspond to chips in the present invention. The molding resin 307 corresponds to a sealing resin in the present invention.

Here, the die pad 301, the lead terminals 302*a* and 302*b*, the semiconductor device 303, the matching circuit substrate 304, the bonding wire 305, the thin plates 316*a* and 316*b*, the molding resin 307, the fixing projection 318, and the fixing hole 319 are the same as the die pad 201, the lead terminals 202*a* and 202*b*, the semiconductor device 203, the matching circuit substrate 204, the bonding wire 205, the thin plates 216*a* and 216*b*, the molding resin 207, the fixing projection 218, and the fixing hole 219 shown in FIG. 4, respectively, so that the descriptions are omitted. It is to be noted that the fixing projection 318 and the fixing hole 319 correspond to the second fixing projection and the second fixing hole in the present invention.

As shown in (a) in FIG. 13, the thin plates 306*a* and 306*b* are disposed on the opposite sides of the region on which the semiconductor device 303 and the matching circuit substrate 304 are mounted on the main surface of the die pad 301. The thin plates 306*a* and 306*b* have respective fixing holes 309 for being fixed to the die pad 301, and the fixing projections 308 of the die pad 301 are engaged with the corresponding fixing holes 309. It is to be noted that the fixing projection 308 and the fixing hole 309 correspond to the first fixing projection and the first fixing hole in the present invention.

The thin plates 306*a* and 306*b* are made of, for example, metal such as copper and brass. Moreover, the both surfaces of each of the thin plates 306*a* and 306*b* are roughened entirely in advance through, for example, chemical processing using chemicals and physical processing such as sandblasting.

As described above, since the thin plates 306*a* and 306*b* are disposed on the opposite sides of the region on which the semiconductor device 303 and the matching circuit substrate 304 are mounted on the main surface of the die pad 301, the shapes of the thin plates 306*a* and 306*b* are not limited by the arrangement positions of the semiconductor device 303 and the matching circuit substrate 304. Thus, the resin package 300 having versatility can be provided.

As described above, with the resin package 300 according to this embodiment, the thin plates 306*a* and 306*b* are disposed on the opposite sides of the region on which the semiconductor device 303 and the matching circuit substrate 304 are mounted on the main surface of the die pad 301, thereby providing the resin package 300 from which the molding resin 307 is not detached easily due to high adhesion between the molding resin 307, and the thin plates 306*a* and 306*b* and the thin plates 316*a* and 316*b*, as in the resin package 200 shown in Embodiment 1. With this, a resin package with great reliability (heat resistant of a solder, and long term reliability) can be provided. Moreover, the shapes of the thin plates 306*a* and 306*b* are not limited by the arrangement positions of the semiconductor device 303 and the matching circuit substrate 304. Thus, the resin package 300 having versatility can be provided.

It is to be noted that the present invention is not limited to the above embodiments, and various modifications may be made without materially departing from the principles and spirit of the present invention.

For example, the above thin plate may be roughened or not roughened. Moreover, the roughening may be performed on the both surfaces, or one surface of the thin plate. Moreover, the roughening may be performed on the entire surface or a part of the surface of the thin plate.

Moreover, the above roughening may be performed through chemical processing using chemicals and physical processing such as sandblasting. Moreover, the thin plate may have through holes or grooves.

Moreover, although the fixing projection and the fixing hole are engaged with each other in the above resin package, the fixing projection and the fixing hole may be crimped.

Moreover, the thin plate may be disposed around the semiconductor device and the matching circuit substrate, or at the opposite sides of the region on which the semiconductor device and the matching circuit substrate are mounted, on the main surface of the die pad.

Moreover, the materials for the die pad, the lead terminals, the thin plates, the molding resin, and the bonding wire are not limited to the foregoing, but may be appropriately changed. Moreover, the sizes and shapes of the die pad, the lead terminals, the thin plates, the molding resin, and the bonding wire are not limited to the foregoing, but may be appropriately varied.

Moreover, various modifications to the embodiments that are conceived by a person skilled in the art and other embodiments obtainable by combining the structural elements in the embodiments without materially departing from the principles and spirit of the present invention are included within the scope of the present invention. For example, a high frequency circuit system including the resin package according to the present invention may be included in the present invention.

INDUSTRIAL APPLICABILITY

The resin package according to the present invention is applicable to a base station for a mobile communication which uses a high frequency signal with a high output, or microwave appliances such as a microwave oven.

REFERENCE SIGNS LIST 100A, 100B, 100C, 200, 300 Resin package
101, 201, 301 Die pad
102a, 102b, 202a, 202b, 302a, 302b Lead terminal
103, 203, 303 Semiconductor device (chip)
104, 204, 304 Matching circuit substrate (chip)
105, 205, 305 Bonding wire
206, 216a, 216b, 206a, 306a, 306b, 316a, 316b Thin plate
107, 207, 307 Molding resin (sealing resin)
208, 308 Fixing projection (First fixing projection)
209, 309 Fixing hole (First fixing hole)
218, 318 Fixing projection (Second fixing projection)
219, 319 Fixing hole (Second fixing hole)

The invention claimed is:

1. A resin package comprising:
a die pad having a main surface on which a chip is mounted;
at least one lead terminal electrically connected to the chip;
a thin plate fixed to at least one of the main surface of the die pad and a main surface of the at least one lead terminal; and
sealing resin which covers the chip and the thin plate;
wherein one surface of the thin plate is roughened,
one of the main surface of the die pad and the main surface of the thin plate has a first fixing hole,
the other of the main surface of the die pad and the main surface of the thin plate has a first fixing projection, and
the first fixing hole and the first fixing projection are engaged with each other.

2. The resin package according to claim 1,
wherein the thin plate is positioned around the chip on the main surface of the die pad.

3. The resin package according to claim 1,
wherein a plurality of the thin plates are positioned at opposite sides of a region where the chip is mounted on the main surface of the die pad.

4. The resin package according to claim 1,
wherein the first fixing hole and the first fixing projection are crimped.

5. The resin package according to claim 1,
wherein one of the main surface of the at least one lead terminal and a main surface of the thin plate has a second fixing hole,
the other of the main surface of the at least one lead terminal and the main surface of the thin plate has a second fixing projection, and
the second fixing hole and the second fixing projection are engaged with each other.

6. The resin package according to claim 5,
wherein the second fixing hole and the second fixing projection are crimped.

7. The resin package according to claim 1,
wherein both surfaces of the thin plate are roughened.

8. The resin package according to claim 1,
wherein the surface of the thin plate is roughened in advance, before the thin plate is attached to the die pad.

9. The resin package according to claim 1,
wherein the thin plate is roughened by forming at least one of grooves or holes.

* * * * *